United States Patent
Igaki et al.

(10) Patent No.: US 7,482,895 B2
(45) Date of Patent: Jan. 27, 2009

(54) SURFACE ACOUSTIC WAVE FILTER

(75) Inventors: Tsutomu Igaki, Hyogo (JP); Kazuo Ikeda, Osaka (JP); Akio Tsunekawa, Osaka (JP)

(73) Assignee: Panasonic Corporation, Osaka (JP)

( * ) Notice: Subject to any disclaimer, the term of this patent is extended or adjusted under 35 U.S.C. 154(b) by 336 days.

(21) Appl. No.: 10/563,281

(22) PCT Filed: Jul. 28, 2004

(86) PCT No.: PCT/JP2004/011116

§ 371 (c)(1),
(2), (4) Date: Jan. 3, 2006

(87) PCT Pub. No.: WO2005/013481

PCT Pub. Date: Feb. 10, 2005

(65) Prior Publication Data

US 2007/0109075 A1     May 17, 2007

(30) Foreign Application Priority Data

Jul. 30, 2003   (JP) ............................. 2003-282590

(51) Int. Cl.
*H03H 9/64* (2006.01)
*H03H 9/25* (2006.01)
(52) U.S. Cl. ..................... 333/195; 333/193; 310/313 D
(58) Field of Classification Search .................. 333/193, 333/195; 310/313 B, 313 D
See application file for complete search history.

(56) References Cited

U.S. PATENT DOCUMENTS

| | | | | |
|---|---|---|---|---|
| 5,486,800 A | * | 1/1996 | Davenport | .................. 333/193 |
| 5,635,883 A | * | 6/1997 | Penunuri et al. | ............. 333/195 |
| 5,638,036 A | * | 6/1997 | Penunuri et al. | ............. 333/194 |
| 5,682,126 A | * | 10/1997 | Plesski et al. | ................ 333/193 |
| 6,163,236 A | * | 12/2000 | Thomas | ....................... 333/195 |
| 6,940,368 B2 | * | 9/2005 | Plessky et al. | .............. 333/193 |
| 7,112,912 B2 | * | 9/2006 | Inoue et al. | ............. 310/313 B |

(Continued)

FOREIGN PATENT DOCUMENTS

JP     1-236809     *     9/1989

(Continued)

*Primary Examiner*—Barbara Summons
(74) *Attorney, Agent, or Firm*—Wenderoth, Lind & Ponack, L.L.P.

(57) ABSTRACT

A saw filter of the invention has a piezoelectric substrate (11), plural numbers of IDT electrodes (12,13) arranged on a surface of the piezoelectric substrate (11) as well as on a first surface acoustic wave propagation path, reflector electrodes (14,15) arranged at least at both ends of a first electrode pattern formed including the plural IDT electrodes (12,13), one or more IDT electrodes (16) arranged on the surface of the piezoelectric substrate (11) as well as on a second surface acoustic wave propagation path which is different from the first surface acoustic wave propagation path and reflector electrodes arranged at least at both sides of a second electrode pattern formed including the IDT electrode (16), in which the IDT electrodes (12,13) on the first surface acoustic wave propagation path are electrically connected in series by connecting wirings (19) and the IDT electrode (16) on the second surface acoustic wave propagation path is connected between the connecting wirings (19) and the ground (20), which are arranged between the first electrode pattern and the second electrode pattern. According to this, the chip size can be made small.

9 Claims, 9 Drawing Sheets

U.S. PATENT DOCUMENTS 7,304,553 B2 * 12/2007 Bauer et al. .................. 333/193

FOREIGN PATENT DOCUMENTS

| JP | 5-183380 | 7/1993 |
| JP | 8-265099 | 10/1996 |
| JP | 9-505974 | 6/1997 |
| JP | 10-261932 | 9/1998 |
| JP | 2002-016470 | 1/2002 |
| JP | 2003-174350 | 6/2003 |
| WO | WO 03/081773 | * 10/2003 |

* cited by examiner

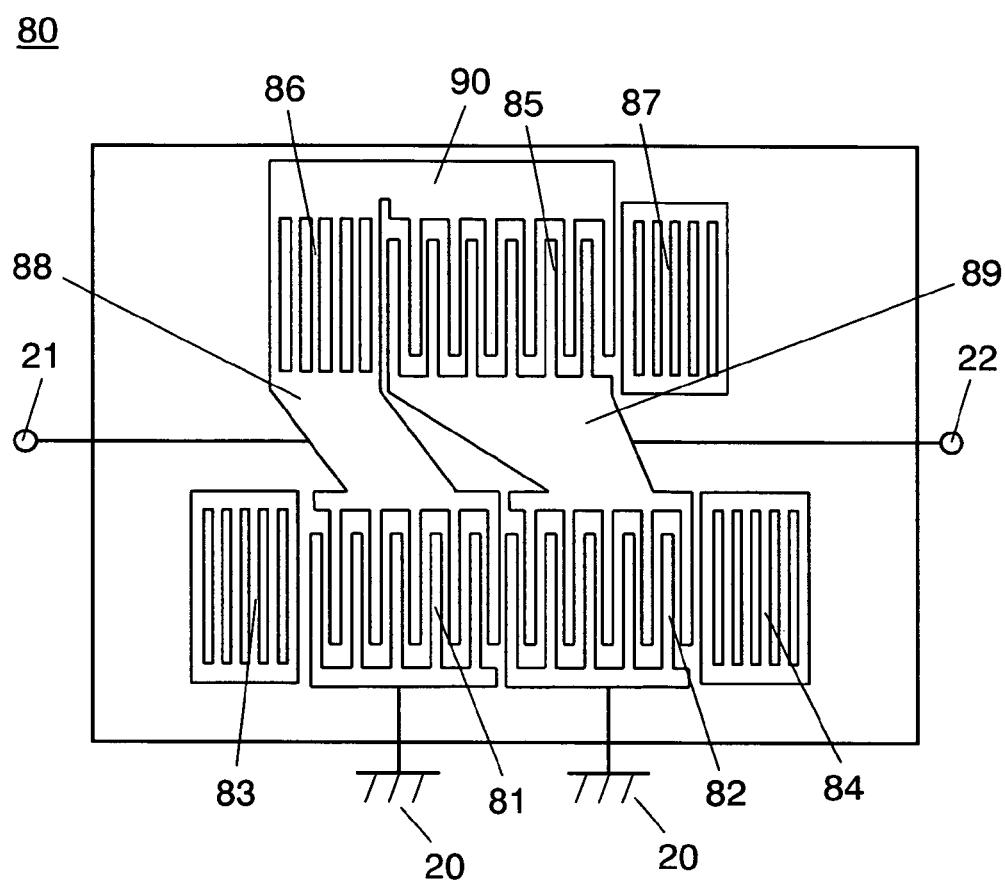

SURFACE ACOUSTIC WAVE FILTER

TECHNICAL FIELD

The present invention relates to a surface acoustic wave filter mainly used for a mobile phone and the like.

BACKGROUND ART

A surface acoustic wave filter (hereinafter, referred to as SAW filter) is used for a mobile phone and the like to select nothing but a required frequency band. In the SAW filter, it is required to widen the pass bandwidth, to increase suppression capability and to reduce insertion loss. With respect to such requirements, a structure of a ladder-type SAW filter in which a normal bandwidth is widened, insertion loss is reduced and suppression capability other than the normal bandwidth is increased is shown in JP-A-5-183380. According to this, a first surface acoustic wave resonator with a pair of terminals having a prescribed resonant frequency is arranged in a parallel arm, and a second surface acoustic wave resonator with a pair of terminals having a resonant frequency which almost corresponds to an anti-resonant frequency of the first resonator is arranged in a series arm. Further, a structure that an inductance is added in series to the first surface acoustic wave resonator is also disclosed.

Not only the above structure but also a various kinds of structures for realizing a better filter characteristic are proposed and put into practical use.

SAW filter 200 having a structure shown in FIG. 14 is generally used in many cases. SAW filter 200 shown in FIG. 14 includes three surface acoustic wave resonators in series arms 204, 212, 220 and two surface acoustic wave resonators in parallel arms 228, 236 formed on piezoelectric substrate 202, and a prescribed filter characteristic is obtained by connecting these resonators. Specifically, surface acoustic wave resonators in series arms 204, 212, 220 respectively include interdigital transducer electrodes (hereinafter, referred to as IDT electrodes) 206, 214, 222 and reflector electrodes 208, 210, 216, 218, 224, 226 disposed at both sides. Surface acoustic wave resonators in parallel arms 228, 236 also include IDT electrodes 230, 238 and reflector electrodes 232, 234, 240, 242 disposed at both sides respectively. Three surface acoustic wave resonators in series arms 204, 212, 220 are connected in series through first connecting wirings 242, 244. Surface acoustic wave resonators in parallel arm 228, 236 are connected to second connecting wirings 246, 248 connecting to first connecting wirings 242, 244, and the other sides are connected to ground 250. Further, surface acoustic wave resonators 204, 220 disposed at outer sides respectively in three surface acoustic wave resonators 204, 212, 220 in series arms are connected to input terminal 252 and output terminal 254.

According to the structure, SAW filter 200 having the prescribed characteristic can be realized. However, in order to increase out-of-band attenuation in the structure, it is required to increase the number of surface acoustic resonators. For the purpose, the chip size has to be increased.

The invention solves the conventional problems, and an object thereof is to provide a SAW filter that can be miniaturized while having a high attenuation characteristic.

DISCLOSURE OF THE INVENTION

In order to achieve the above object, the invention comprising the following structures.

A saw filter of the invention has a piezoelectric substrate, plural numbers of IDT electrodes arranged on a surface of the piezoelectric substrate as well as on a first surface acoustic wave propagation path, reflector electrodes arranged at least at both ends of a first electrode pattern formed including the plural IDT electrodes, one or more IDT electrodes arranged on the surface of the piezoelectric substrate as well as on a second surface acoustic wave propagation path which is different from the first surface acoustic wave propagation path and reflector electrodes arranged at least at both sides of a second electrode pattern formed including the IDT electrode, in which the IDT electrodes on the first surface acoustic wave propagation path are electrically connected in series by connecting wirings and the IDT electrode on the second surface acoustic wave propagation path is connected between the connecting wirings and ground, which are arranged between the first electrode pattern and the second electrode pattern.

According to this, it can be a structure in which plural numbers of resonators arranged in series are integrated, therefore, the chip size can be made small while securing a good characteristic as a SAW filter.

In the SAW filter of the invention, at least one surface acoustic wave resonator can be formed by the IDT electrode arranged on the second surface acoustic wave propagation path and reflector electrodes arranged at least at both ends of the second electrode pattern formed including the IDT electrode.

The SAW filter of the invention can be a structure in which ones of terminals of plural IDT electrodes arranged on the second surface acoustic wave propagation path are connected to ground, and the others of terminals are connected to different connecting wirings respectively.

In the SAW filter of the invention having the above structure, the plural IDT electrodes disposed on the first surface acoustic wave propagation path and electrically connected in series can be arranged so that phases of adjacent IDT electrodes are opposite to each other.

In the SAW filter of the invention having the above structure, a reflector electrode can be provided between IDT electrodes of the first electrode pattern formed arranging further plural IDT electrodes.

In the SAW filter of the invention, the reflector electrode provided between the IDT electrodes of the first electrode pattern can be connected to ground.

In the SAW filter of the invention, the IDT electrodes of the first electrode pattern can be electrically connected in series through the reflector electrode.

In the SAW electrode of the invention, in the first electrode pattern, adjacent IDT electrodes can be arranged so that phases thereof are same to each other.

A SAW filter of the invention forms surface acoustic wave resonators including a piezoelectric substrate, plural numbers of IDT electrodes arranged on a surface of the piezoelectric substrate as well as on a first surface acoustic wave propagation path, reflector electrodes arranged at least at both ends of a first electrode pattern formed including the plural IDT electrodes, one or more IDT electrodes arranged on a surface of the piezoelectric substrate as well as on a second surface acoustic wave propagation path which is different from the first surface acoustic wave propagation path and reflector electrodes arranged at least at both ends of a second electrode pattern formed including the IDT electrode, in which ones of terminals in the IDT electrodes of the first electrode pattern are respectively connected to ground, and the others of terminals are connected to different terminals of the surface acoustic wave resonator.

According to this, the plural numbers of surface acoustic wave resonators (hereinafter, referred to as resonators) arranged in parallel can be integrated, the characteristic as a SAW filter can be maintained to approximately the same degree or further improved, and the chip size can be made small.

As described above, the SAW filter of the invention has the structure in which plural resonators are integrated, therefore, even when a SAW filter having a high-attenuation characteristic which requires a lot of resonators, the chip size can be made small to provide a low-cost SAW filter.

BRIEF DESCRIPTION OF THE DRAWINGS

FIG. 5 is a plan view showing an electrode structure of a SAW filter according to a fifth embodiment of the invention;

BEST MODE FOR CARRYING OUT THE INVENTION

Hereinafter, embodiments of the invention will be explained in detail with reference to the drawings. Since same marks are put to the same components, explanations thereof are omitted in some cases.

First Embodiment

Figure 1:
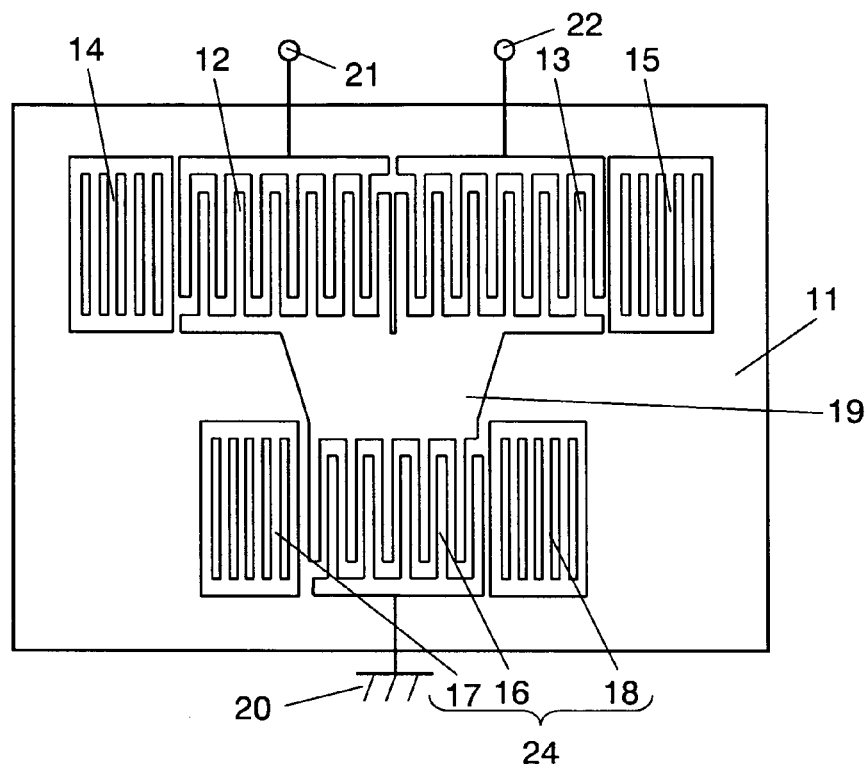
FIG. 1 is a plan view showing an electrode structure of a SAW filter on a piezoelectric substrate according to a first embodiment of the invention.

FIG. 1 is a plan view showing an electrode structure of SAW filter 10 on piezoelectric substrate 11 according to a first embodiment of the invention. SAW filter 10 of the embodiment has the following structure. Two IDT electrodes 12, 13 are arranged so as to be adjacent to each other on a surface of piezoelectric substrate 11 as well as on a first surface acoustic wave propagation path to form a first electrode pattern. Reflector electrodes 14, 15 are disposed at both ends of the first electrode pattern having the IDT electrodes 12, 13.

IDT electrode 16 is disposed on the surface of the same piezoelectric substrate 11 as well as on a second surface acoustic wave propagation path which is different from the first surface acoustic wave propagation path, and reflector electrodes 17, 18 are arranged at both ends thereof. In the embodiment, IDT electrode 16 and reflector electrodes 17, 18 on the second surface acoustic wave propagation path form one resonator 24.

Further, as shown in the drawing, respective ones of terminals of IDT electrodes 12, 13 on the first surface acoustic wave propagation path are electrically connected in series by connecting wirings 19. The others of terminals thereof are respectively connected to input terminal 21 and output terminal 22. According to this, on the first surface acoustic wave propagation path, two IDT electrodes 12, 13 and two reflector electrodes 14, 15 substantially forms two resonators. IDT electrode 16 arranged on the second surface acoustic wave propagation path is connected between connecting wirings 19 and ground 20. Namely, in the embodiment, resonator 24 is connected between connecting wirings 19 and ground 20.

According to the above structure, three-resonators are required to be formed when forming by the conventional ladder-type, however, the above structure can be formed by the area corresponding to almost two resonators of the conventional structure. Therefore the chip size can be miniaturized.

An example of a specific structure of SAW filter 10 of the invention will be explained as follows. As piezoelectric substrate 11, a piezoelectric substrate having a predetermined cut-angle such as a lithium niobate ($LiNbO_3$) single crystal substrate or a lithium tantalate ($LiTaO_3$) single crystal substrate. In the following specific example, a 36° Y-cut X propagation lithium tantalate ($LiTaO_3$) single crystal substrate is used as piezoelectric substrate 11. After an electrode film in which copper is doped into aluminum is formed to have a film thickness of 400 nm on piezoelectric substrate 11, prescribed shapes as IDT electrodes and reflector electrodes and the like are fabricated by a photolithography process and an etching process. The first electrode pattern is arranged on the surface of the piezoelectric substrate as well as on the first surface acoustic wave propagation path, and in IDT electrodes 12, 13 included in the first electrode pattern, the electrode finger pitch of comb-shaped electrodes is 2.34 µm, which are 70 pairs respectively. A gap between two IDT electrodes 12, 13 is 1.17 µm. The electrode finger pitch of reflector electrodes 14, 15 is 2.40 µm, the number of electrode fingers is 50. A gap made between reflector electrode 14 and IDT electrode 12 and gaps made between reflector electrode 15 and IDT electrode 13 are respectively 1.17 µm.

In surface acoustic wave resonator 24 connected between connecting wirings 19 and ground 20, the electrode finger pitch of comb-shaped electrodes included in IDT electrode 16 is 2.44 µm, the number of pairs of which is 80 pairs. Both ends thereof, are provided with reflector electrodes 17, 18, where the electrode finger pitch of which is 2.50 µm and the number of electrode finger is 50.

Connecting wirings 19 can be simultaneously fabricated when IDT electrodes 12, 13, 16 and reflector electrodes 14, 15 17, 18 are formed by the photolithography process and the etching process. Further, in order to reduce the resistance of connection wirings 19, a reinforcing electrode film can be formed on the electrode thin film.

In two IDT electrodes 12, 13 of the first electrode pattern, the ripple can be reduced by making their phases the reverse of each other. Whereas, when making the phases same to each other, the electrodes tend to interfere with each other and the ripple is rather increased, but loss can be reduced. Therefore, it is preferable to use the phase depending on design for realizing a characteristic of each target.

In the embodiment, two IDT electrodes are arranged on the first surface acoustic wave propagation path, and one IDT electrode is arranged on the second surface acoustic wave propagation path, however, the invention is not limited to this. For example, three or more IDT electrodes can be provided on the first surface acoustic wave propagation path, and two or more IDT electrodes can be provided on the second surface acoustic wave propagation path. In this case, reflector electrodes can be provided between IDT electrodes.

Second Embodiment

Figure 2:
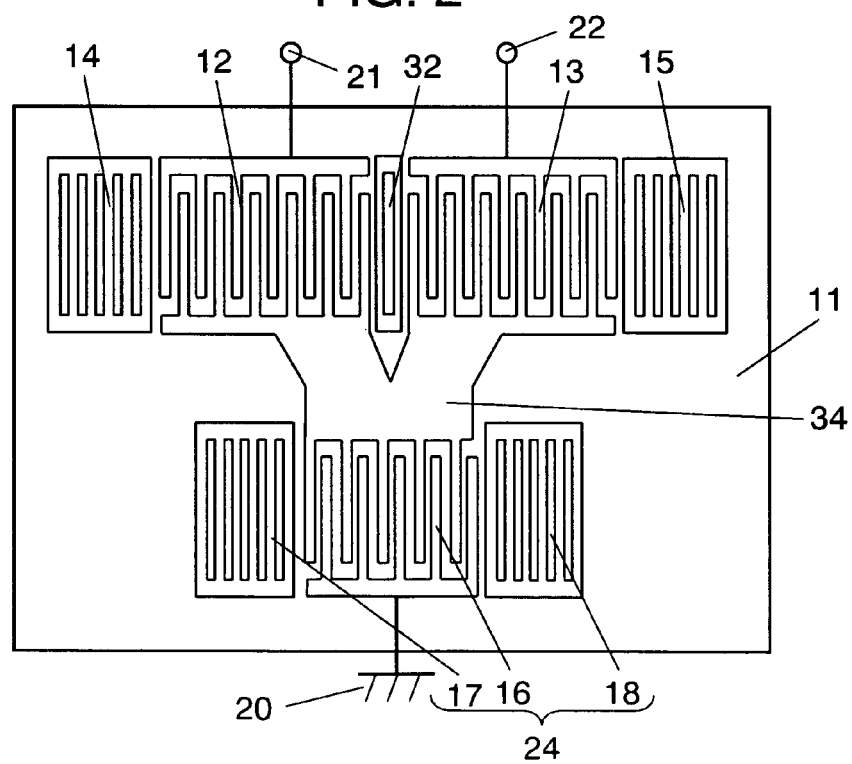
FIG. 2 is a plan view showing an electrode structure of a SAW filter according to a second embodiment of the invention.

Hereinafter, SAW filter 30 according to a second embodiment of the invention will be explained with reference to FIG. 2. As shown in FIG. 2, SAW filter 30 of the embodiment differs from SAW filter 10 of the first embodiment in the following point. Namely, in the embodiment, reflector electrode 32 is provided between two IDT electrodes 12, 13 included in a first electrode pattern on a first surface acoustic wave propagation path.

An example of a specific structure in FIG. 2 will be explained. In the example of the specific structure explained in the first embodiment, reflector electrode 32 of which electrode finger pitch is 2.40 µm and of which the number of electrode fingers is 10 is arranged between two IDT electrodes 12, 13 included in the first electrode pattern. Respective gaps made between reflector electrode 32 and IDT electrodes 12, 13 are, for example, 1.17 µm.

By providing reflector electrode 32 between two IDT electrodes 12, 13, the stray capacitance can be reduced and the attenuation in a high-frequency side can be prevented from deteriorating. The ripple can be reduced as reflector electrode 32 is provided, even when making the phases of two IDT electrodes 12, 13 same to each other.

The number of electrodes in reflector electrode 32 provided between IDT electrodes 12, 13 is required to be large to reduce the effect of stray capacitance. However, if there are too many electrodes, the chip size increases, therefore, it is preferable that the number of electrodes is smaller than the number of electrodes of reflector electrodes 14, 15 provided at both ends.

By only arranging reflector electrode 32, the stray capacitance can be reduced and the deterioration of attenuation in the high-frequency side can be prevented, and when connecting to ground, the effect of preventing the deterioration of attenuation further increases, as a result, the characteristic can be further improved.

In the embodiment, two IDT electrodes are arranged on the first surface acoustic wave propagation path and one IDT electrode is arranged on the second surface acoustic wave propagation path, however, the invention is not limited to this. For example, three or more IDT electrodes can be provided on the first surface acoustic wave propagation path and two or more IDT electrodes can be provided on the second surface acoustic wave propagation path, and reflector electrodes can be provide between these IDT electrodes. Further, these reflector electrodes can be connected to ground.

Third Embodiment

Figure 3:
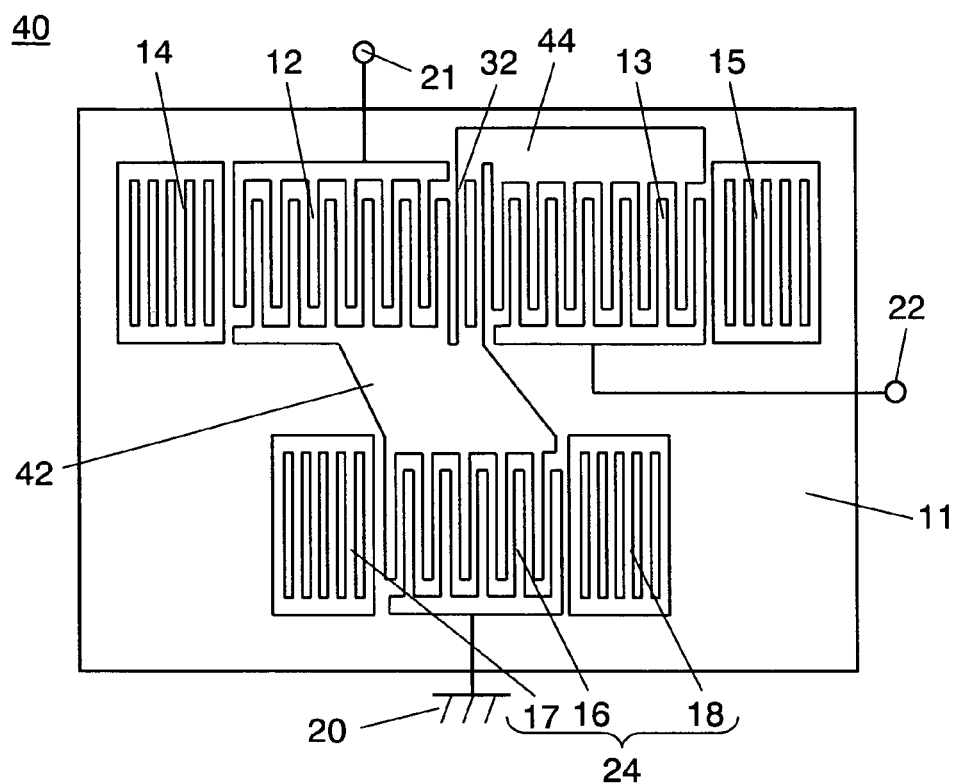
FIG. 3 is a plan view showing an electrode structure of a SAW filter according to a third embodiment of the invention.

FIG. 3 is a plan view showing an electrode structure of a SAW filter according to a third embodiment of the invention. SAW filter 40 of the embodiment has the same structure as SAW filter 30 of the second embodiment concerning IDT electrodes 12, 13, 16 and reflector electrodes 14, 15, 17, 18, 32. However, in the embodiment, two IDT electrodes 12, 13 included in a first electrode pattern on a first surface acoustic wave propagation path are connected in series through reflector electrode 32 by connecting wirings 42, 44. Resonator 24 is connected between connecting wirings 42 and ground 20, which are arranged between the first electrode pattern and a second electrode pattern.

As described above, SAW filter 40 of the embodiment connects two IDT electrodes in series through reflector electrode 32, connecting wirings 42, 44. When thus connecting in series through reflector electrode 32, a similar characteristic can be obtained. Therefore, a degree of freedom in design for connecting IDT electrodes 12, 13 in series can be high, including a connecting position to output terminal 22 and the like.

In the embodiment, two IDT electrodes are arranged on the first surface acoustic wave propagation path and one IDT electrode is arranged on the second surface acoustic wave propagation path, however, the invention is not limited to this. For example, three or more IDT electrodes can be provided on the first surface acoustic wave propagation path and two or more IDT electrodes can be provided on the second surface acoustic wave propagation path, reflector electrodes can be provided between these IDT electrodes, and the IDT electrodes on the first surface acoustic wave propagation path can be connected in series by the reflector electrode and the connecting wirings.

Fourth Embodiment

Figure 4:
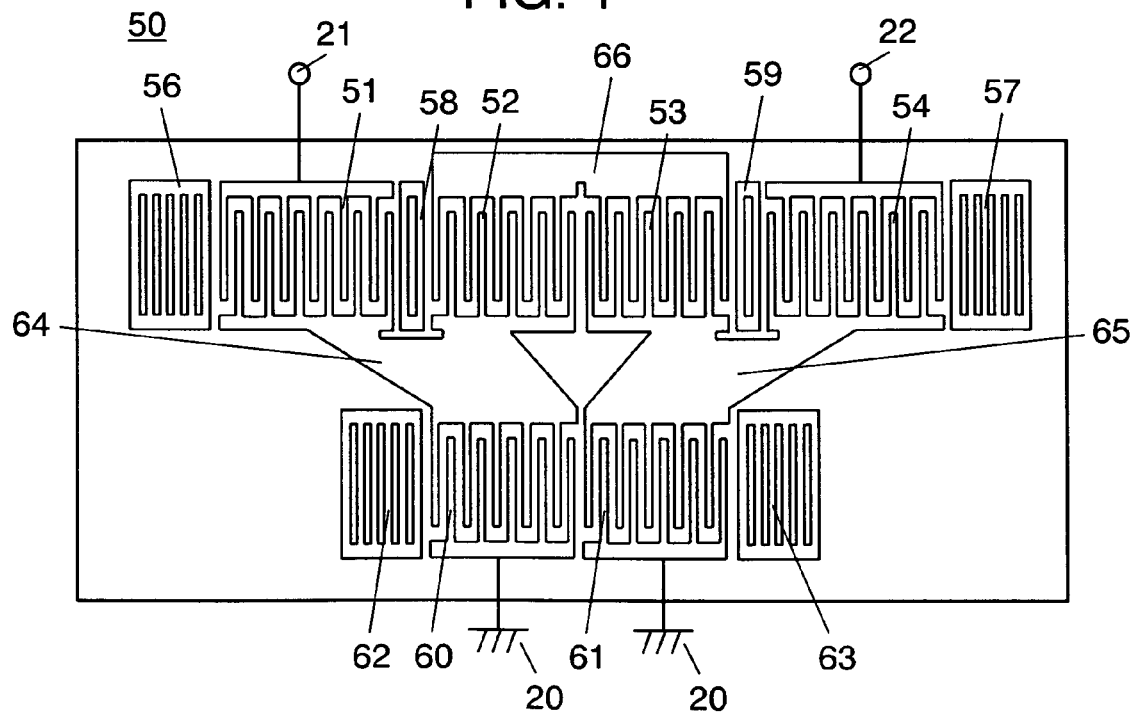
FIG. 4 is a plan view showing an electrode structure of a SAW filter according to a fourth embodiment of the invention.

FIG. 4 is a plan view showing an electrode structure of SAW filter 50 according to a fourth embodiment of the invention. SAW filter 50 of the embodiment is provided with a first electrode pattern and reflector electrodes 56, 57 arranged at both ends of the first electrode pattern on a first surface acoustic wave propagation path. The first electrode pattern includes four IDT electrodes 51, 52, 53, 54 and two reflector electrodes 58, 59. As shown in the drawing, these reflector electrodes 58, 59 are arranged between two IDT electrodes 51, 52 and between another two IDT electrodes 53, 54 respectively.

A second electrode pattern including two IDT electrodes 60, 61 is formed on a second surface acoustic wave propagation path which is different from the first surface acoustic wave propagation path, and reflector electrodes 62, 63 are arranged at both ends of the second electrode pattern.

Further, four IDT electrodes 51, 52, 53, 54 on the first surface acoustic wave propagation path are electrically connected in series by connecting wirings 64, 65, 66. IDT electrodes 60, 61 on the second surface acoustic wave propagation path are connected between connecting wirings 64, 65 and ground 20, which are disposed between the first electrode pattern and the second electrode pattern. In the embodiment, as shown in FIG. 4, IDT electrode 60 is connected to connecting wiring 64 and ground 20 and another IDT electrode 61 is connected to connecting wiring 65 and ground 20.

Respective ones of terminals of IDT electrodes 51, 54 are respectively connected to input terminal 21 and output terminal 22.

An example of a specific structure of the SAW filter of the invention will be explained as follows. In the first electrode pattern, the number of pairs of comb-shaped electrodes as IDT electrodes 51, 54 is 70 pairs, the number of pairs of comb-shaped electrodes as IDT electrodes 52, 53 is 60 pairs, and the electrode finger pitch of the comb-shaped electrodes is 2.34 μm as same as the first embodiment. Further, in IDT electrodes 60, 61 of the second electrode pattern, the electrode finger pitch of comb-shaped electrodes is 2.44 μm, which are 80 pairs respectively, and a gap between IDT electrodes 60, 61 is 1.22 μm. In reflector electrodes 62, 63 arranged at both ends thereof, the electrode finger pitch is 2.50 μm and the number of electrode fingers is 50. Gaps between reflector electrodes 62, 63 and IDT electrodes 60, 61 are respectively 1.20 μm.

The electrode finger pitch of reflector electrodes 58, 59 arranged in the first electrode pattern is 2.5 μm, and the number of electrode fingers is respectively 10. In the embodiment, a reflector electrode is not provided between two IDT electrodes 52, 53 arranged at the center of the first electrode pattern. This is because it has been found that the stray capacitance between two IDT electrodes 51,52 as well as two IDT electrodes 53, 54 in the first electrode pattern affects the attenuation on a high-frequency side, however, the stray capacitance between two IDT electrodes 52, 53 at the center hardly affect it. However, a reflector electrode can be provided between these. A degree of freedom in design can be high if providing with the reflector electrode.

In the conventional ladder-type, the ripple tends to increase when the number of pairs of comb-shaped electrodes in the series-arm resonator is approximately less than 100 pairs. In the embodiment, since two IDT electrodes 52, 53 are disposed adjacent to each other, the each number of pairs of comb-shaped electrodes is 60 pairs, however, a state substantially having 120 pairs is realized, as a result, the ripple can be suppressed. Concerning IDT electrodes 51, 54, when the number of electrodes of reflector electrodes 58, 59 arranged respectively is made to be approximately 10, the effect to the ripple can be reduced, and if the number of pairs of comb-shaped electrodes is approximately 70 pairs, the occurrence of ripple can be almost prevented.

As described above, it was necessary that six resonators were formed by the conventional ladder-type structure, however, two resonator groups can form the filter in the embodiment. Consequently, the chip size can be miniaturized without making the SAW filter characteristic deteriorate.

Reflector electrodes 58, 59 of the first electrode pattern are not connected to ground, however, they can be connected to ground as described in the second embodiment.

Fifth Embodiment

FIG. 5 is a plan view showing an electrode structure of SAW filter 80 according to a fifth embodiment of the invention. SAW filter 80 of the embodiment differs from SAW filter 10 shown in FIG. 1 in the following point. Namely, in SAW filter 10 of the first embodiment 1, IDT electrodes 12, 13 of the series resonators connected to input terminal 21 and output terminal 22 are provided on a first surface acoustic wave propagation path. On the other hand, in SAW filter 80 of the embodiment, IDT electrodes 81, 82 are provided on the first surface acoustic wave propagation path, ones of terminals of which are connected to input terminal 21 and output terminal 22, and others of terminals of which are connected to ground. IDT electrode 81 on the first surface acoustic wave propagation path is connected to reflector electrode 86 on a second surface acoustic wave propagation path by connecting wiring 88, reflector electrode 86 is connected to IDT electrode 85 by connecting wiring 90, and further, IDT electrode 85 on the second surface acoustic wave propagation path is connected to IDT electrode 82 on the first surface acoustic wave propagation path by connecting wiring 89. According to this, two IDT electrodes 81, 82 on the first surface acoustic wave propagation path are electrically connected in series by connecting wirings 88, 89, 90 and reflector electrode 86. IDT electrode 85, reflector electrodes 86, 87 form a resonator on the second surface acoustic wave propagation path, and two IDT electrodes 81, 82 on a first electrode pattern are connected to different terminals of the above resonator.

According to the above structure, it was necessary that three resonators are formed in the SAW filter of the conventional ladder-type structure, however, SAW filter 80 of the invention can be formed by the area corresponding to almost two resonators. As a result, the chip size can be miniaturized.

Hereinafter, a specific example of a structure of the SAW filter according to the embodiment will be explained. IDT electrodes 81, 82 are arranged on the first surface acoustic wave propagation path on piezoelectric substrate 11 to form the first electrode pattern. Reflector electrodes 83, 84 are arranged at both ends of the first electrode pattern. In two IDT electrodes 81, 82, the electrode finger pitch of comb-shaped electrodes is 2.44 μm, which are 80 pairs respectively. A gap between two IDT electrodes 81, 82 is 1.22 μm. Further, in reflector electrodes 83, 84, the electrode finger pitch is 2.50 μm, and the number of electrodes is 50. A gap between reflector electrode 83 and IDT electrode 81 and a gap between reflector electrode 84 and IDT electrode 82 are respectively 1.20 μm.

Further, in IDT electrode 85 on the second surface acoustic wave propagation path, the electrode finger pitch of comb-shaped electrodes is 2.34 μm, which are 70 pairs. In reflector electrodes 86, 87 disposed at both ends of IDT electrode 85, the electrode finger pitch is 2.40 μm, and the number of electrode fingers is 50. IDT electrode 85 and reflector electrodes 86, 87 form a resonator. Input terminal 21 is connected to connecting wiring 88 and output terminal 22 is connected to connecting wiring 89.

According to the SAW filter structure, the filter can be formed by the area corresponding to almost two resonators of SAW filter of the conventional ladder-type structure. As a result, the chip size can be miniaturized and a SAW filter which is low in cost can be realized.

In the embodiment, two IDT electrodes are arranged on the first surface acoustic wave propagation path, and one IDT electrode is arranged on second surface acoustic wave propagation path, however, the invention is not limited to this. For example, three or more IDT electrodes can be provided on the first surface acoustic wave propagation path and two or more IDT electrodes can be provided on the second surface acoustic wave propagation path.

Furthermore, the invention is not limited to the structures explained in the first embodiment to the fifth embodiments, and structures having various kinds of IDT electrodes and reflector electrodes can be available. It is also preferable that phases of adjacent IDT electrodes can be reversed, or can be the same.

Hereinafter, a specific example of a SAW filter having a structure which is based on SAW filter 50 according to the fourth embodiment and is modified partially will be explained concerning the result of measuring filter characteristics.

Figure 6A:
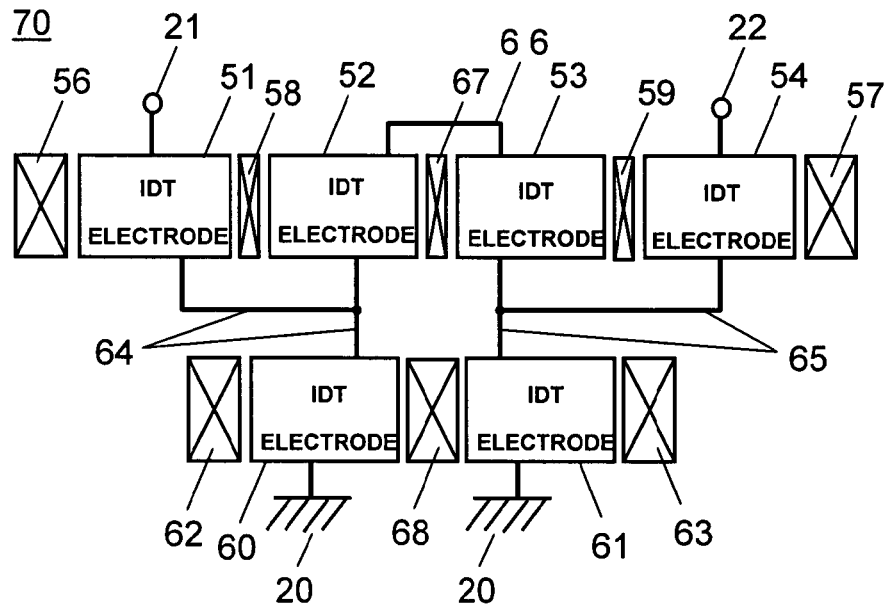
FIG. 6A is a block diagram showing a filter structure fabricated for measuring a characteristic of the SAW filter of the invention.

FIG. 6A is a block diagram showing a filter structure fabricated for measuring a characteristic of the SAW filter of the invention. In FIG. 6A, IDT electrodes and reflector electrodes are shown by block forms to make the explanation easy. In SAW filter 70 shown in FIG. 6A, four IDT electrodes 51, 52, 53, 54 and reflector electrodes 56, 57, 58, 59, 67 are respectively arranged at both sides of these IDT electrodes on the first surface acoustic wave propagation path. IDT electrodes 60, 61 and reflector electrodes 62, 63, 68 which are arranged at both ends and the center of the IDT electrodes are arranged on the second surface acoustic wave propagation path. IDT electrodes 51, 52, 53, 54 on the first surface acoustic wave propagation path are electrically connected in series by connecting wirings 64, 65, 66. IDT electrode 60 of the second surface acoustic wave propagation path is connected to connecting wiring 64 and ground 20, and another IDT electrode 61 is connected to connecting wiring 65 and ground 20.

IDT electrodes 51, 52 have 158 pairs respectively, IDT electrodes 53, 54 have 216 pairs respectively, and the intersecting widths thereof are both 25 μm. The number of electrode fingers of reflector electrodes 56, 57 is 30, and the number of electrode fingers of reflector electrodes 58, 59, 60 arranged in the first electrode patter is 10. Further, IDT electrodes 60, 61 on the second surface acoustic wave propagation path have 147 pairs and 263 pairs respectively. The number of electrode fingers of reflector electrodes 62, 63, 68 is 30. "η" is set to 0.52. A film thickness of electrodes is approximately 160 nm. In the case of SAW filter 70, IDT electrodes 51, 52, 53 54 in the first electrode pattern are made to be the same phase.

Figure 6B:
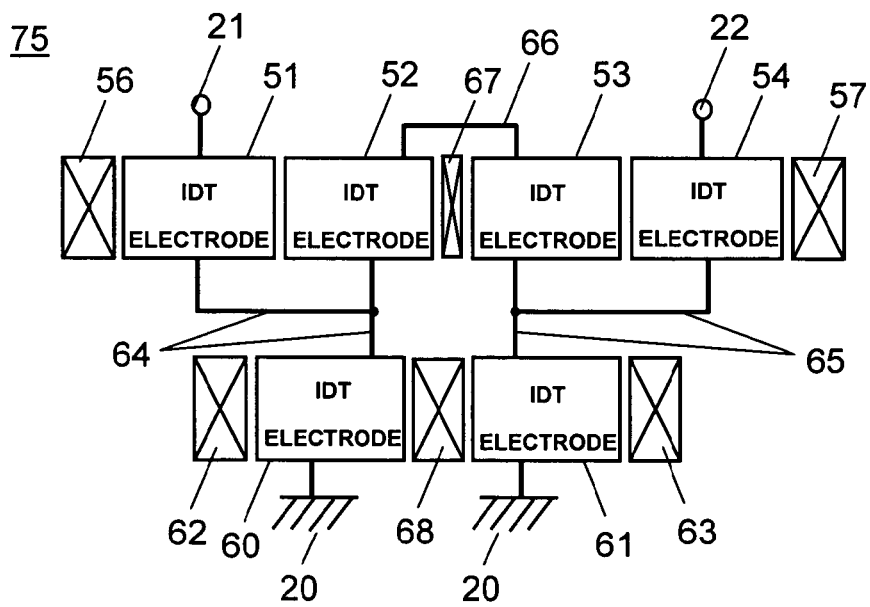
FIG. 6B is a block diagram showing another filter structure fabricated for measuring a characteristic of the SAW filter of the invention.

FIG. 6B is a block diagram showing another filter structure fabricated for measuring a characteristic of the SAW filter of the invention. Also in FIG. 6B, IDT electrodes and reflector electrodes are shown by block forms to make the explanation easy. SAW filter 75 shown in FIG. 6B differs from SAW filter 70 shown in FIG. 6A in points that a reflector electrode in the first electrode pattern is only reflector electrode 67 at the center, phases of two adjacent IDT electrodes 51, 52 and IDT electrodes 53, 54 are made to be reversed, and phases of adjacent IDT electrodes 52, 53 through reflector electrode 67 are made to be same.

Figure 14:
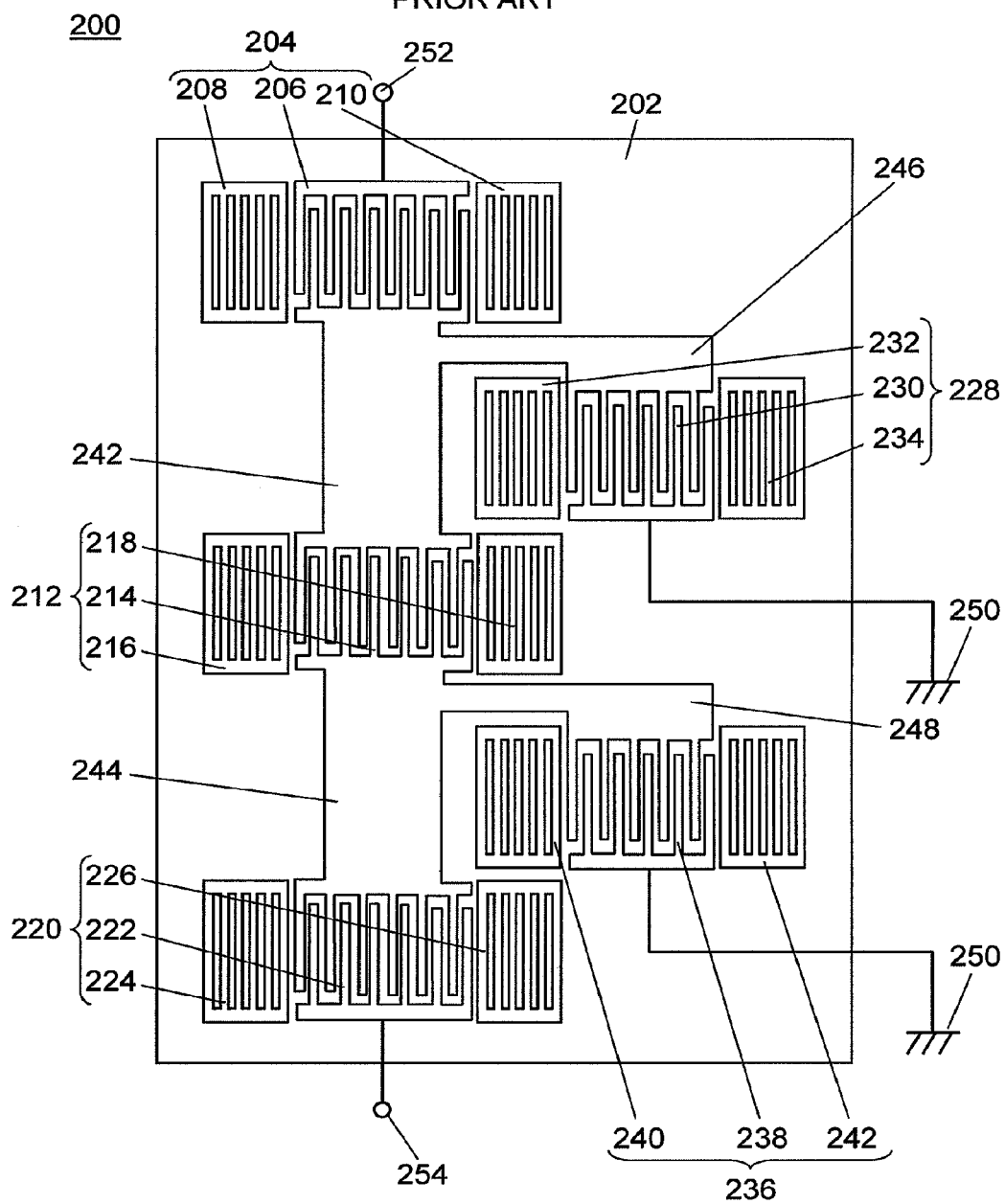
FIG. 14 is a view showing a conventional SAW filter having a conventional ladder-structure.

Further, a SAW filter shown in FIG. 14 having the conventional structure is also fabricated. The number of pairs, the intersecting width and the like are same as the structure shown in FIG. 6A and FIG. 6B.

Figure 7:
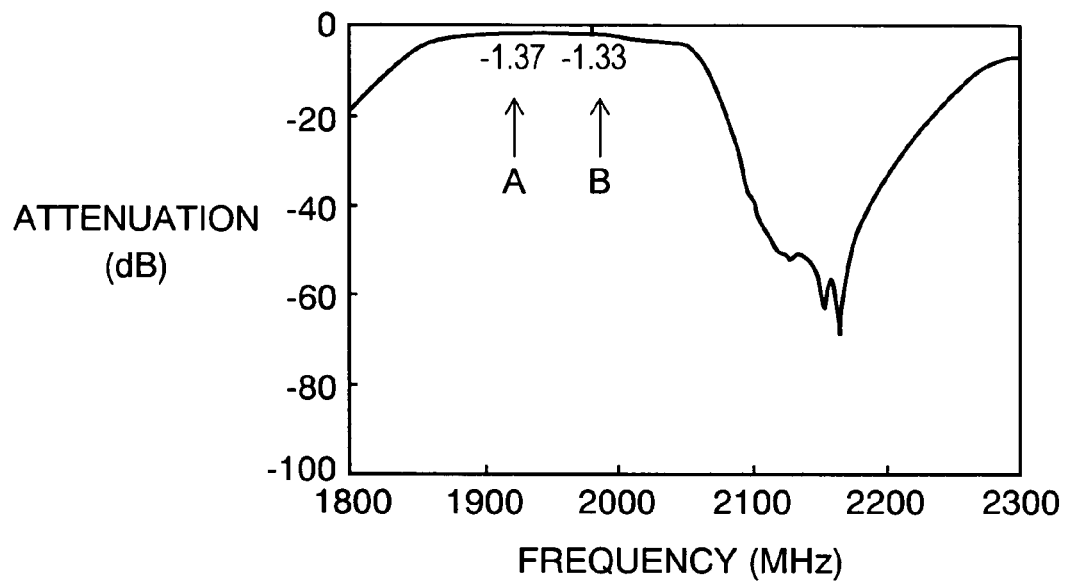
FIG. 7 is a graph showing a result of measuring the characteristic of the filter structure shown in FIG. 6A.
Figure 8:
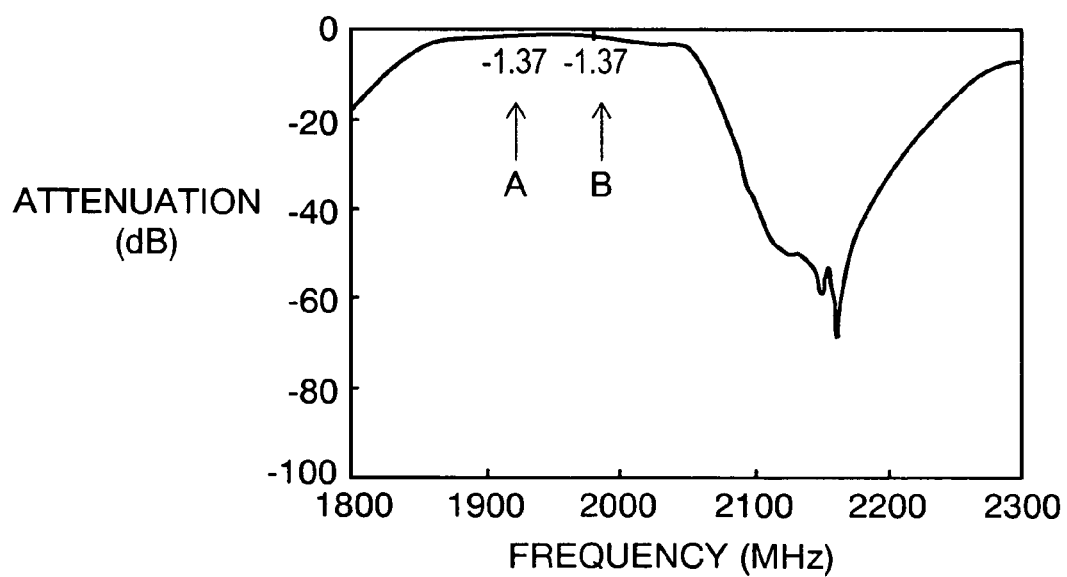
FIG. 8 is a graph showing a result of measuring the characteristic of the filter structure shown in FIG. 6B.
Figure 9:
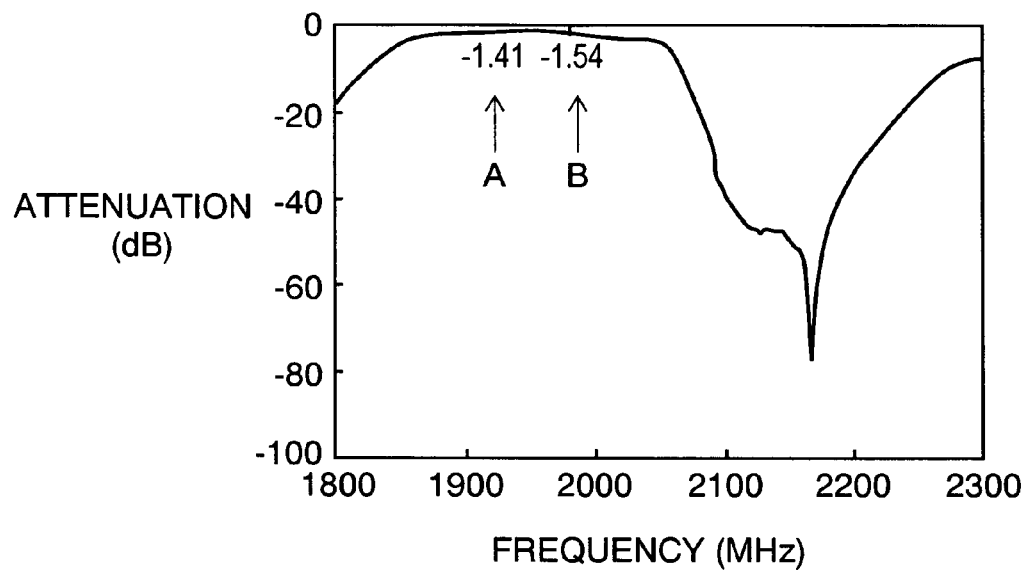
FIG. 9 is a graph showing a result of measuring the characteristic of a SAW filter having a conventional structure.

Measured results of these filter characteristics are shown in FIG. 7, FIG. 8 and FIG. 9. FIG. 7 is a graph showing a characteristic of SAW filter 70. FIG. 8 is a graph showing a characteristic of SAW filter 75. Further, FIG. 9 is a graph showing a characteristic of the SAW filter having the conventional structure. As can be seen from the drawings, in the SAW filter of the conventional structure, insertion loss at an A-point of a prescribed frequency in a pass band was 1.41 dB, and insertion loss at a B-point was 1.54 dB. On the contrary, in SAW filter 70, insertion loss at an A-point was 1.37 dB and insertion loss of at a B-point was 1.33 dB. In SAW filter 75, insertion loss at the A-point was 1.37 dB and insertion loss of at the B-point was 1.37 dB. Consequently, it has been found that the SAW filters of the invention can reduce insertion loss as compared with the SAW filter of the conventional structure. Especially, it has been found that a better characteristic can be obtained by providing reflectors between IDT electrodes, phases of which are made to be the same. SAW filters experimentally manufactured in the embodiment is for PCS application, in which the frequency at the A point is 1930 MHz and the frequency at the B-point is 1990 MHz.

As described above, in the SAW filter of the invention, it has been found that the chip size can be miniaturized and insertion loss can also be reduced. The reason why insertion loss can be reduced is presumed as follows.

Considering the resonance of IDT electrode 51 in SAW filter 75 shown in FIG. 6B, the electrode finger pitch of IDT electrode 52 works as a reflector electrode having the different electrode finger pitch from reflector electrode 56 and the number of electrode fingers are larger, therefore, the effective resonance length becomes long. As a result, the Q-value of reflectors becomes large and insertion loss becomes small when forming a filter. On the other hand, in SAW filter 70 shown in FIG. 6A, by making the phase of IDT electrode 51 same as the phase of adjacent IDT electrode 52, apart of surface acoustic wave passed through reflector electrode 58 disposed therebetween is propagated as signals, therefore, insertion loss can be further reduced.

Next, a result of measuring a characteristic of a SAW filter having a structure shown in FIG. 10 will be explained. Also in FIG. 10, IDT electrodes and reflector electrodes are shown in block forms to make the explanation easy.

Figure 10:
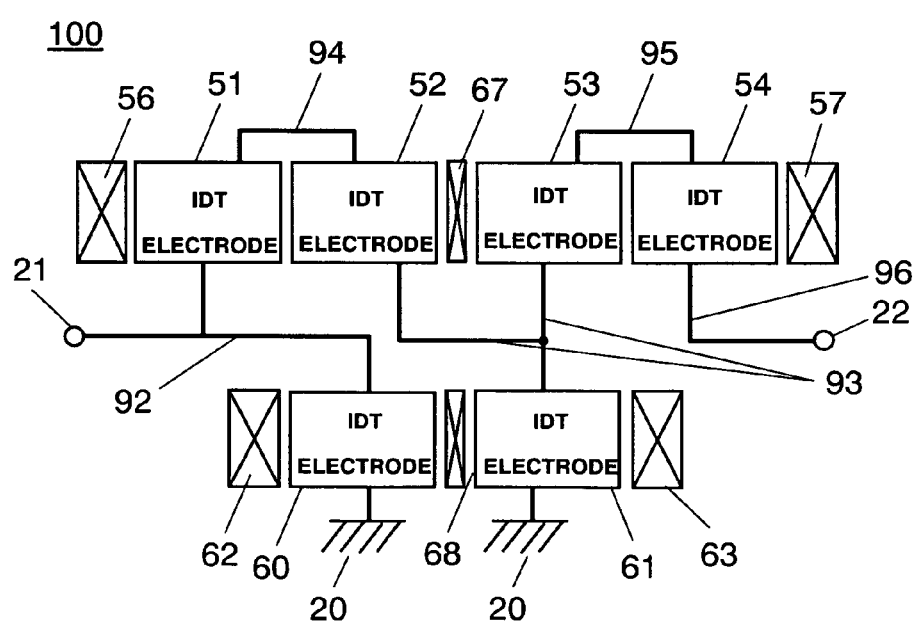
FIG. 10 is a block diagram showing further another filter structure fabricated for measuring a characteristic of the SAW filter of the invention.

SAW filter 100 shown in FIG. 10 is provided with four IDT electrodes 51, 52, 53, 54 and reflector electrodes 56, 57 disposed at both ends thereof and reflector electrode 67 arranged between IDT electrodes 52, 53 at the center on the first surface acoustic wave propagation path. On the second surface acoustic wave propagation path, IDT electrodes 60, 61 and reflector electrodes 62, 63, 68 are provided at the center and both ends. IDT electrodes 51, 52, 53, 54 are electrically connected in series by connecting wirings 92, 93, 94, 95. IDT electrode 60 on the second surface acoustic wave propagation path is connected to connecting wiring 92 and ground 20, and another IDT electrode 61 is connected to connecting wiring 93 and ground 20.

SAW filter 100 is characterized in that input terminal 21 is connected to connecting wiring 92 and output terminal 22 is connected to one terminal of IDT electrode 54.

All the IDT electrodes 51, 52, 53, 54 have 84 pairs and the intersecting widths thereof are all 25 μm. The number of electrode fingers of reflector electrodes 56, 57 is 35, and the number of electrode fingers of reflector electrode 67 arranged in the first electrode pattern is 10. Further, IDT electrodes 60, 61 on the second surface acoustic wave propagation path have respectively 73 pairs, 68 pairs. The number of electrode fingers of reflector electrode 62, 63 is 35, the number of electrode fingers of reflector electrode 68 at the center is 7. "η" is set to 0.5. A film thickness of electrodes is approximately 400 nm.

Furthermore, a ladder-structure having two resonators on the second surface acoustic wave propagation path is also fabricated. At this time, the number of pairs and the number of electrode fingers and the like of IDT electrodes and reflector electrodes are set to be same as SAW filter 100 shown in FIG. 10.

Figure 11:
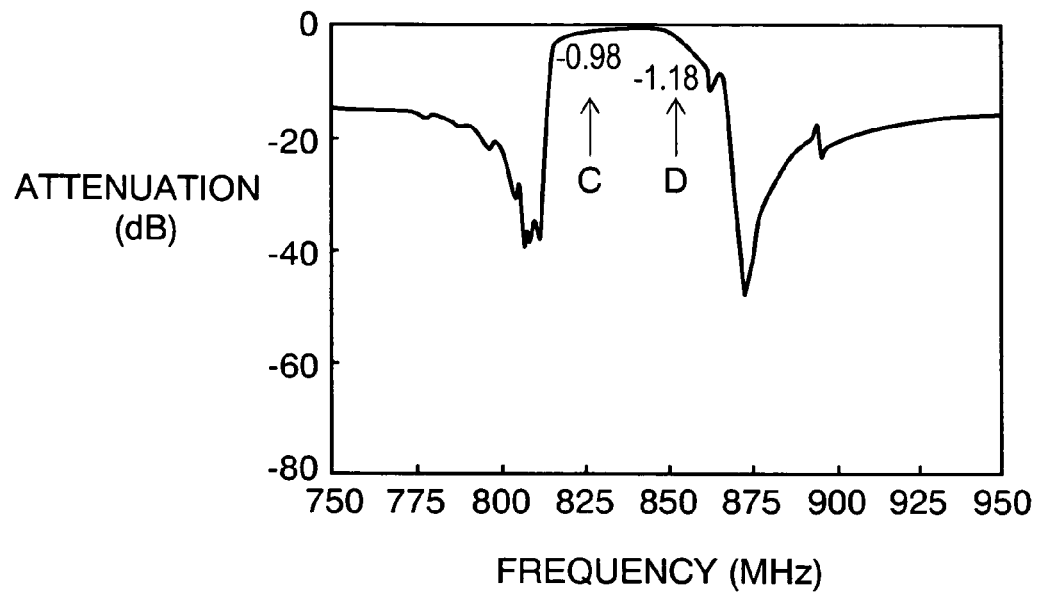
FIG. 11 is a graph showing a result of measuring the characteristic when phases of IDT electrodes on a second surface acoustic wave propagation path are same in the filter structure shown in FIG. 10.
Figure 12:
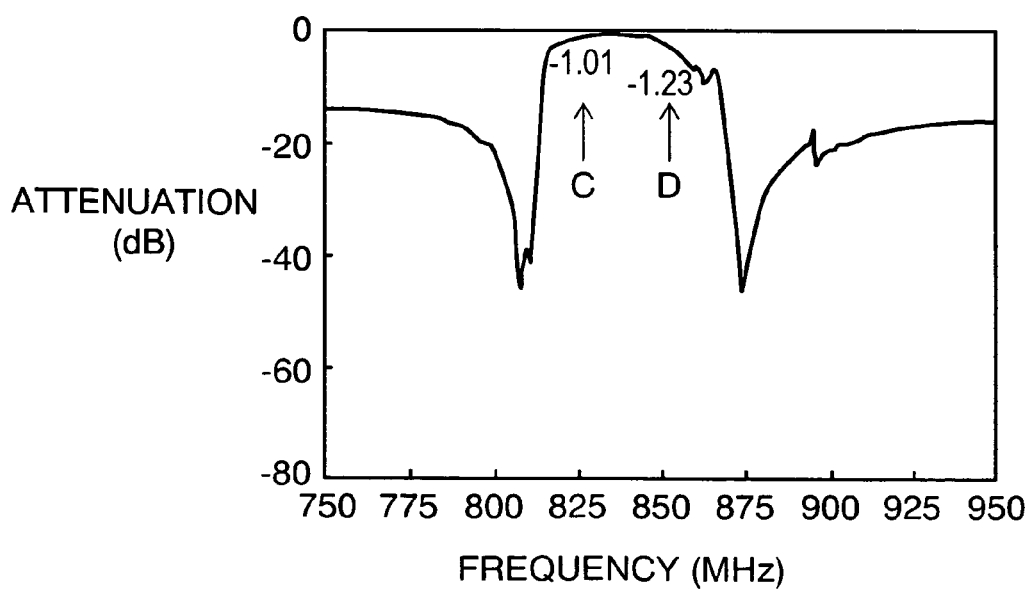
FIG. 12 is a graph showing a result of measuring a characteristic when phases of IDT electrodes on the second surface acoustic wave propagation path are opposite in the filter structure shown in FIG. 10.
Figure 13:
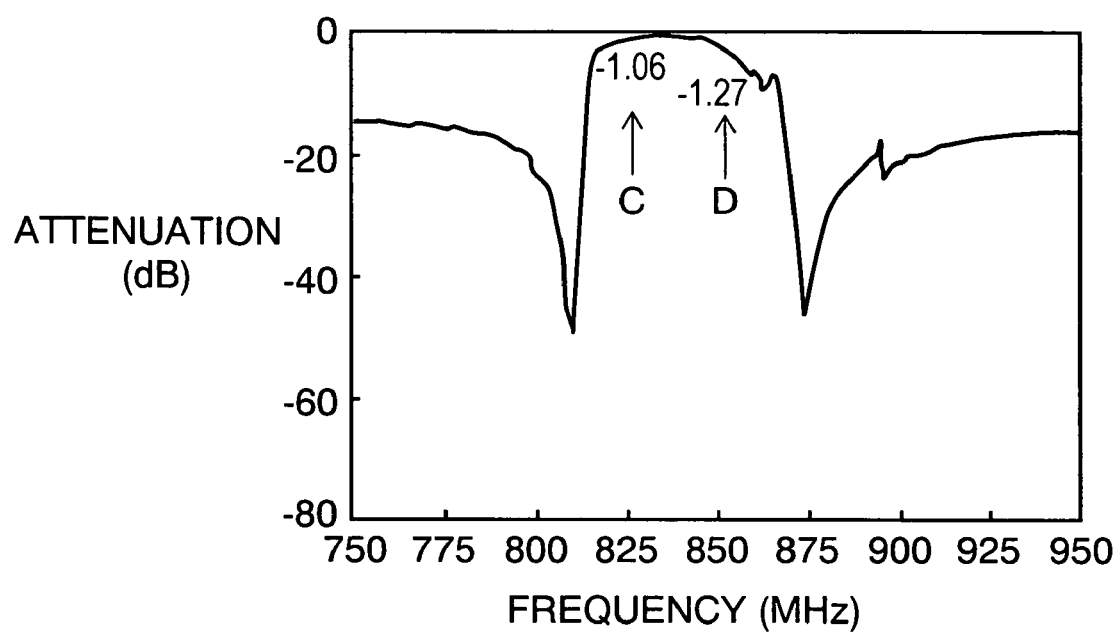
FIG. 13 is a graph showing a result of measuring a characteristic when two resonators having a ladder-structure are formed by IDT electrodes and reflector electrodes provided on the second surface acoustic wave propagation path in the filter structure shown in FIG. 10.

FIG. 11 is the case in which IDT electrodes 60, 61 on the second surface acoustic wave propagation path are made to be the same phase in SAW filter 100. FIG. 12 is the case in which IDT electrodes 60, 61 are made to be reversed phases in the same SAW filter 100. Further, FIG. 13 is the case in which two ladder-structure resonators are provided on the second surface acoustic wave propagation path. In these cases, phases of two IDT electrodes 51, 52 and phases of two IDT electrodes 53, 54 are reversed, and phases of two IDT electrodes 52, 53 are the same.

As shown in FIG. 13, in the SAW filter having the ladder structure by IDT electrodes and reflector electrodes on the second surface acoustic wave propagation path, insertion loss at a C-point in prescribed frequency of a pass band was 1.06 dB, and insertion loss at a D-point was 1.27 dB. On the other hand, as shown in FIG. 11, when the phases are same, insertion loss at the C-point was 0.98 dB and insertion loss at the D-point was 1.18 dB. Further, as shown in FIG. 12, when the phases are opposite, insertion loss at the C-point was 1.01 dB, and insertion loss at the D-point was 1.23 dB. SAW filters experimentally manufactured in the embodiment is for AMPS application, in which the frequency at the C point is 824 MHz and the frequency at the D-point is 849 MHz.

As described above, good results for the characteristic as the SAW filter can be obtained.

INDUSTRIAL APPLICABILITY

The SAW filter according to the invention, when used as a filter having a high-attenuation characteristic which requires a lot of resonators, allows the chip size to be small and useful for a filter in a communication field such as a mobile phone, or an image field such as a television.

LIST OF REFERENCE MARKS IN DRAWINGS 10, 30, 40, 50, 70, 75, 80, 100, 200: SAW FILTER
11, 202: PIEZOELECTRIC SUBSTRATE
19, 42, 44, 64, 65, 66, 88, 89, 90, 92, 93, 94, 95: CONNECTING WIRING
20, 250: GROUND
21, 252: INPUT TERMINAL
22, 254: OUTPUT TERMINAL
24, 204, 212, 220, 228, 236: SURFACE ACOUSTIC WAVE RESONATOR (RESONATOR)
12, 13, 16, 51, 52, 53, 54, 60, 61, 62, 63, 68, 81, 82, 85, 206, 214, 222,
230, 238: IDT ELECTRODE
14, 15, 17, 18, 32, 56, 57, 58, 59, 62, 63, 67, 68, 86, 87, 208, 210, 216,
218, 224, 226, 232, 234, 240, 242: REFLECTOR ELECTRODE
242, 244: FIRST CONNECTING WIRING
246, 248: SECOND CONNECTING WIRING

What is claimed is:

1. A surface acoustic wave filter, comprising:
a piezoelectric substrate;
a first electrode pattern having at least four interdigital transducer electrodes and at least one inner reflector electrode arranged on a surface of the piezoelectric substrate and on a first surface acoustic wave propagation path;
reflector electrodes arranged at least at both ends of the first electrode pattern including the at least four interdigital transducer electrodes;
a second electrode pattern having a plurality of interdigital transducer electrodes arranged on the surface of the piezoelectric substrate and on a second surface acoustic wave propagation path which is different from the first surface acoustic wave propagation path; and
reflector electrodes arranged at least at both ends of the second electrode pattern including the plurality of interdigital transducer electrodes,
wherein the at least four interdigital transducer electrodes on the first surface acoustic wave propagation path are electrically connected in series by connecting wirings,
each of the plurality of interdigital transducer electrodes on the second surface acoustic wave propagation path is connected between the connecting wirings and ground, and
at least some of the connecting wirings are arranged between the first electrode pattern and the second electrode pattern,
wherein the at least one inner reflector electrode has a fewer number of electrode fingers than the reflector electrodes arranged at both ends of the first electrode pattern, and at least one adjacent pair of the interdigital transducer electrodes of the first electrode pattern has no reflector electrode therebetween, and
wherein some terminals of the plurality of interdigital transducer electrodes arranged on the second surface acoustic wave propagation path are connected to ground, and the other terminals of the plurality of interdigital transducer electrodes are connected to different connecting wirings respectively.

2. The surface acoustic wave filter of claim 1,
wherein at least one surface acoustic wave resonator is formed by the plurality of interdigital transducer electrodes arranged on the second surface acoustic wave propagation path and reflector electrodes arranged at least at both ends of the second electrode pattern formed including the plurality of interdigital transducer electrodes.

3. The surface acoustic wave filter of claim 2,
wherein the at least four interdigital transducer electrodes disposed on the first surface acoustic wave propagation path and electrically connected in series are arranged so that adjacent interdigital transducer electrodes have a reverse phase relative to each other.

4. The surface acoustic wave filter of claim 1,
wherein the at least four interdigital transducer electrodes disposed on the first surface acoustic wave propagation path and electrically connected in series can be arranged so that phases of adjacent interdigital transducer electrodes are the reverse of each other.

5. The surface acoustic wave filter of claim 1,
wherein the reflector electrode provided between the interdigital transducer electrodes of the first electrode pattern is connected to ground.

6. The surface acoustic wave filter of claim 1,
wherein the interdigital transducer electrodes of the first electrode pattern are electrically connected in series through the at least one inner reflector electrode.

7. The surface acoustic wave filter of claim 1,
wherein in the first electrode pattern, the adjacent interdigital transducer electrodes are arranged to have a same phase relative to each other.

8. The surface acoustic wave filter of claim 5,
wherein the at least four interdigital transducer electrodes disposed on the first surface acoustic wave propagation path and electrically connected in series can be arranged so that phases of adjacent interdigital transducer electrodes are the reverse of each other.

9. The surface acoustic wave filter of claim 1,
wherein among the at least four interdigital transducer electrodes disposed on the first surface acoustic wave propagation path,
adjacent interdigital transducer electrodes, between which the at least one inner reflector electrode is arranged, have a same phase relative to each other, and
the adjacent pair of the interdigital transducer electrodes, between which no reflector electrode is arranged, have a reverse phase relative to each other.

* * * * *